United States Patent
Oh et al.

(10) Patent No.: US 11,609,244 B2
(45) Date of Patent: Mar. 21, 2023

(54) TEST APPARATUS FOR SEMICONDUCTOR PACKAGE

(71) Applicant: TSE CO., LTD., Chungcheongnam-do (KR)

(72) Inventors: Chang Su Oh, Chungcheongnam-do (KR); Bo Hyun Kim, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 174 days.

(21) Appl. No.: 17/210,970

(22) Filed: Mar. 24, 2021

(65) Prior Publication Data

US 2021/0302468 A1     Sep. 30, 2021

(30) Foreign Application Priority Data

Mar. 26, 2020  (KR) .......................... 10-2020-0036730
Nov. 4, 2020   (KR) .......................... 10-2020-0146037

(51) Int. Cl.
   *G01R 1/04*     (2006.01)
   *G01R 31/27*    (2006.01)

(52) U.S. Cl.
   CPC ........... *G01R 1/0416* (2013.01); *G01R 31/27* (2013.01)

(58) Field of Classification Search
   CPC .... G01R 31/27; G01R 31/28; G01R 31/2851; G01R 31/2896; G01R 1/02; G01R 1/04; G01R 1/0408; G01R 1/0416
   See application file for complete search history.

(56) References Cited

U.S. PATENT DOCUMENTS

| | | | |
|---|---|---|---|
| 2005/0124181 A1* | 6/2005 | Brown ................. | H05K 3/4092 257/E23.078 |
| 2007/0018300 A1* | 1/2007 | Ryu ................... | G01R 31/2886 257/686 |
| 2008/0094086 A1* | 4/2008 | Kim ..................... | G01R 1/0483 324/762.01 |
| 2010/0231248 A1* | 9/2010 | Cho ..................... | G01R 1/0483 324/756.05 |
| 2011/0260309 A1* | 10/2011 | Lee ..................... | G01R 1/0466 439/55 |

(Continued)

FOREIGN PATENT DOCUMENTS

KR    10-2016-0118796    10/2016

*Primary Examiner* — Huy Q Phan
*Assistant Examiner* — David B Frederiksen

(57) ABSTRACT

The present disclosure discloses a test apparatus for testing a package-on-package (POP) type semiconductor package includes a lower socket mounted to a tester board providing a test signal, and provided with a plurality of socket pins connected to a lower terminal of a lower package to electrically connect the lower package and the tester board to each other; a pusher to which an upper package is coupled, the pusher having a pusher body which may be moved to approach the lower socket or to be moved away from the lower socket; and an upper socket coupled to the pusher body, and provided with an insulating pad formed of a nonelastic insulating material and a plurality of electrically-conductive parts supported on the insulating pad, the electrically-conductive part being formed of an elastic insulating material containing a plurality of electrically-conductive particles.

15 Claims, 8 Drawing Sheets

(56) References Cited

U.S. PATENT DOCUMENTS

| | | | |
|---|---|---|---|
| 2012/0105089 A1* | 5/2012 | Song | H01L 22/32 |
| | | | 324/755.05 |
| 2013/0293252 A1* | 11/2013 | Chen | G01R 31/2896 |
| | | | 324/750.16 |
| 2019/0128950 A1* | 5/2019 | Mardi | G01R 31/2891 |
| 2019/0162776 A1* | 5/2019 | Song | H01L 22/14 |

* cited by examiner

TEST APPARATUS FOR SEMICONDUCTOR PACKAGE

CROSS-REFERENCE TO RELATED APPLICATION

This application claims priority of Korean Patent Application No. 10-2020-0036730, filed on Mar. 26, 2020, and priority of Korean Patent Application No. 10-2020-0146037, filed on Nov. 4, 2020, in the KIPO (Korean Intellectual Property Office), the disclosure of which is incorporated herein entirely by reference.

BACKGROUND OF THE INVENTION

Field of the Invention

The present disclosure relates to a test apparatus for a semiconductor package, and more particularly, to a test apparatus for a semiconductor package for inspecting whether normal operation of a package-on-package (POP) type semiconductor package formed by vertically stacking a lower package and an upper package.

Description of the Related Art

A semiconductor package is formed by integrating fine electronic circuits at a high density, and during a manufacturing process, a test process is performed to check whether each electronic circuit is normal. The test process is a process for selecting normal products and defective products by testing whether the semiconductor package is being normally operated.

For testing a semiconductor package, a test apparatus which electrically connects a terminal of the semiconductor package to a tester applying a test signal is utilized. The test apparatus has various structures depending on the type of semiconductor package to be tested.

Recently, as use of a package-on-package (POP) type semiconductor package which minimizes component size and enables signal to be rapidly transmitted has been increased, demand for the test apparatus for testing such semiconductor package has also been steadily continuing.

The package-on-package type semiconductor package is manufactured by sequentially stacking one package on a package performing different function. In a case of a semiconductor package used in a smartphone or tablet PC, in order to implement a three-dimensional package through a vertical expansion, the semiconductor package takes the form of a package-on package in which an application processor (AP), a baseband chip, and a memory are stacked. The package-on-package method can minimize a length of connection wiring to minimize loss such as signal delay and impedance mismatch occurred during a two-dimensional arrangement. In addition, since this method utilizes the spatial vertical direction, a mounting area per unit area can be maximized to realize a large-capacity and micro-element.

In addition, since in the package-on-package method, the tested packages are stacked, so the yield can be increased. For example, in the case of manufacturing each of a logic device and memory device in one package, if one of the two devices is changed, the entire test program and a tester board must be modified, resulting in a problem in that a lot of time and cost are required. However, in the package-on-package method, packages are stacked after each of the logic package and the memory package is tested. Therefore, when a change to any package is occurred, only a test tool for the corresponding package needs to be changed, so this method has the advantage of dramatically reducing time and cost A conventional test apparatus for testing a package-on-package type semiconductor package includes a lower test socket having a pogo pin used to transmit an electrical signal, an upper test socket, and a pusher body coupled to the upper test socket. The lower test socket is installed on the tester board to be electrically connected to a lower package, and an upper package is mounted on the upper test socket to be electrically connected to the upper test socket.

However, in the conventional test apparatus, since a length of signal transmission path between the upper package and the lower package is long, signal distortion is easy to occur in high-speed signal transmission. Therefore, there is a problem in that it is impossible to precisely inspect a semiconductor package that is operated at high speed.

In addition, addition, in the conventional test apparatus, since a plurality of holes are formed in the upper test socket in order to install the pogo pins for electrically connecting the upper package and the lower package, when vacuum pressure is supplied to a pusher to pick up the semiconductor, a pick-up error is easily to occur.

The above-described information disclosed in the background description is provided only for improving the understanding of the background of the present disclosure, and thus may include the information which does not constitute the prior art.

SUMMARY OF THE INVENTION

The present disclosure is conceived in view of the above points, and an object of the present disclosure is to provide a test apparatus for a semiconductor package capable of accurately testing a package-on-package type semiconductor package which is operated at high speed.

In addition, another object of the present disclosure is to provide a test apparatus for a semiconductor package capable of preventing a pickup error when a semiconductor package is picked-up.

Furthermore, still another object of the present disclosure is to provide a test apparatus for a semiconductor package capable of extending the life of a semiconductor package and a test socket.

In order to achieve the above object, a test apparatus for a semiconductor package according to the present disclosure is a test apparatus for a semiconductor package for testing a package-on-package (POP) type semiconductor package and includes a lower socket mounted to a tester board providing a test signal, and provided with a plurality of socket pins connected to a lower terminal of a lower package to electrically connect the lower package and the tester board to each other; a pusher to which an upper package is coupled, the pusher having a pusher body which may be moved to approach the lower socket or to be moved away from the lower socket; and an upper socket coupled to the pusher body, and provided with an insulating pad formed of a nonelastic insulating material and a plurality of electrically-conductive parts supported on the insulating pad, the electrically-conductive part being formed of an elastic insulating material containing a plurality of electrically-conductive particles such that one end thereof may be connected to an upper package terminal of the upper package and the other end thereof may be connected to an upper terminal of the lower package.

In the test apparatus for a semiconductor package according to the present disclosure, the electrically-conductive part may include an electrically-conductive part bump which protrudes from a lower surface of the insulating so as to be compressed to the upper terminal of the lower package.

The test apparatus may include a compression control sheet attached to a lower surface of the insulating pad and having a through hole formed therein to surround a lower end portion of the electrically-conductive bump, with a space part being formed between the through hole and the lower end portion of the electrically-conductive bump.

The volume of the space part of the through hole is included in a range greater than 0.2 times and less than 1.2 times the volume of the upper end portion of the electrically-conductive bump.

In the test apparatus for a semiconductor package according to the present disclosure, a surface of the upper package terminal may be coated with an oxidation-inhibiting metal.

In the test apparatus for a semiconductor package according to the present disclosure, a PCB connecting body may be inserted between the upper package and the upper socket, the PCB connecting body may be provided with pads which are coated with an oxidation-inhibiting metal and mounted on upper and lower surfaces, respectively, of a via having an electrically-conductive path formed on an inner wall or an inner surface thereof, the upper package terminal may be in contact with the pad mounted on the upper surface, and the electrically-conductive part of the upper socket may be in contact with the pad mounted on the lower surface.

The oxidation-inhibiting metal may be gold, palladium, rhodium, cobalt, or an alloy of two or more metals thereof.

The test apparatus for a semiconductor package according to the present disclosure may further include an adsorption pad provided with a suction hole to which vacuum may be supplied through the pusher, and coupled to the insulating pad so as to adsorb the lower package.

The adsorption pad may be movably disposed in an insulating pad hole provided in the insulating pad.

The pusher includes a chamber provided in the pusher body to be opened outward for receiving the upper package therein, and the upper socket may be coupled to the pusher body to seal the chamber.

The test apparatus for a semiconductor package according to the present disclosure may further include a guide housing provided with a receiving groove capable of receiving the lower package therein and disposed above the lower socket, and the pusher may include a catching jaw provided on the pusher body so as to come into contact with the guide housing, thereby limiting a moving distance of the pusher body approaching the lower socket.

The test apparatus for a semiconductor package according to the present disclosure may further include a guide housing provided with a receiving groove capable of receiving the lower package therein and disposed above the lower socket, and an alignment hole may be provided in one of the pusher body and the guide housing, and an alignment pin to be inserted into the alignment hole so as to align the pusher body approaching the lower socket may be provided in the other one of the pusher body and the guide housing.

The pusher may include a buffering unit coupled to the pusher body to buffer pressure applied to the pusher body from a driving part for limiting a load applied to the lower package by the upper socket.

The test apparatus for a semiconductor package according to the present disclosure may further include a support film provided with a plurality of film holes into which the upper package terminals of the upper package may be inserted, and disposed between the upper package and the upper socket to space the upper package and the upper socket apart from each other.

In the test apparatus for a semiconductor package according to the present disclosure, as compared with a conventional test apparatus having a pogo pin structure, a length of signal transmission path is short, so it is possible to prevent signal distortion in high-speed signal transmission and to perform a precision test for a semiconductor package that is operated at high speed.

In addition, in the test apparatus for a semiconductor package according to the present disclosure, there is little risk of leakage of the vacuum pressure between the pusher and the adsorption pad providing for adsorbing the lower package, and by adopting a configuration in which the vacuum pressure is stably transmitted from the pusher to the adsorption pad, it is possible to reduce a pickup error when the lower package is picked-up.

In addition, in the test apparatus for a semiconductor package according to the present disclosure, contact resistance between the electrically-conductive part of the upper socket and the terminal of the upper package is minimized, and the compression amount of the electrically-conductive part of the upper socket can be adjusted according to a test environment, so there is the effect of extending a life of the upper package and the upper socket.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
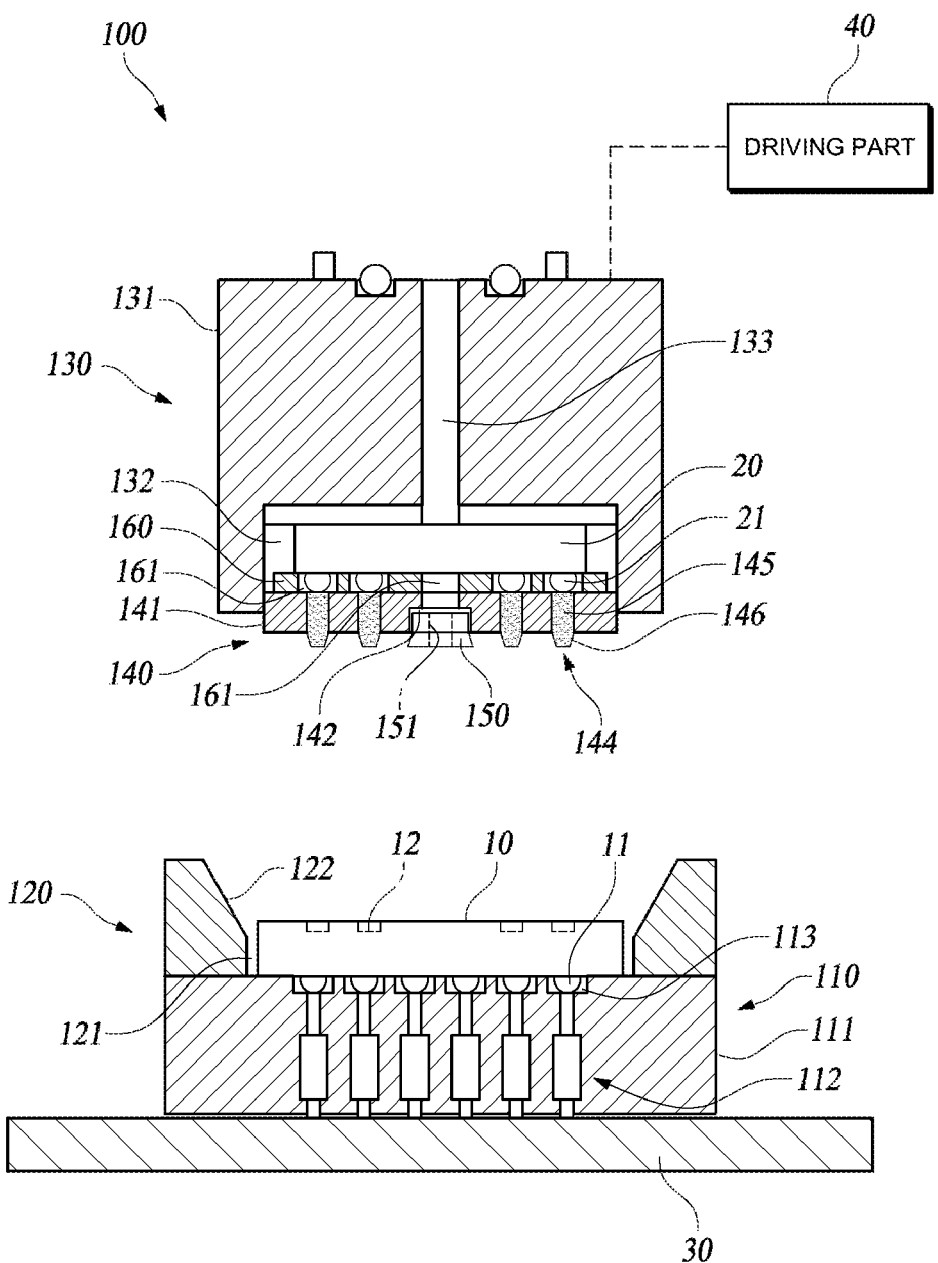
FIG. 1 is a view schematically showing a test apparatus for a semiconductor package according to one embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a test apparatus for a semiconductor package according to preferred embodiments of the present disclosure will be described in detail with reference to the accompanying drawings.

Figure 2:
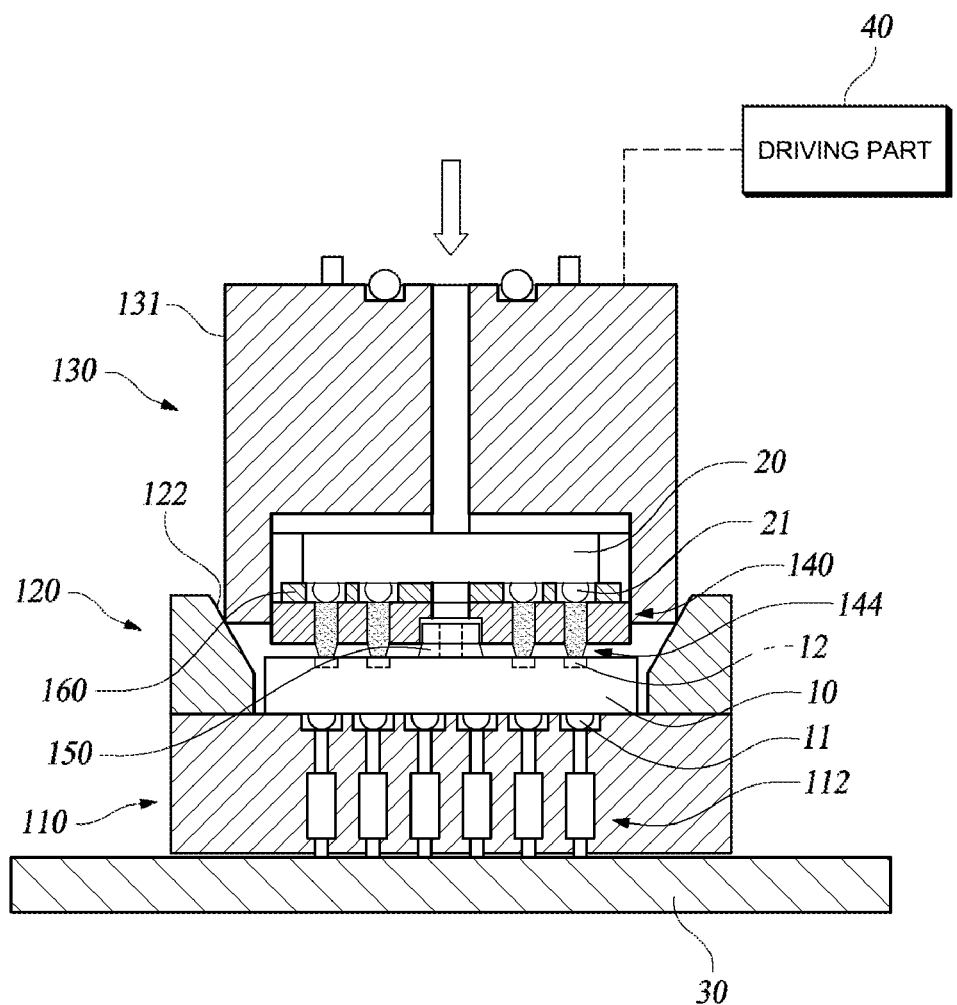
FIG. 2 is a view for explaining operation of the test apparatus for a semiconductor package according to one embodiment of the present disclosure.

FIG. 1 is a view schematically showing a test apparatus for a semiconductor package according to one embodiment of the present disclosure, and FIG. 2 is a view for explaining operation of the test apparatus for a semiconductor package according to one embodiment of the present disclosure.

As shown in the drawings, a test apparatus 100 for a semiconductor package according to one embodiment of the present disclosure is utilized for testing a package-on-package type (POP) semiconductor package including a lower package 10 and an upper package 20, and may electrically connect a tester board 30 generating a test signal and the package-on-package type (POP) semiconductor package. The test apparatus 100 for a semiconductor package includes a lower socket 110 mounted to the tester board 30, a guide housing 120 coupled to the lower socket 110, a pusher 130 which may be moved by a moving force transmitted from a driving part 40 thereto, an upper socket 140 coupled and mounted to the pusher 130, and an adsorption pad 150 disposed on the upper socket 140 to adsorb the lower package 10.

The lower socket 110 is mounted to the tester board 30 to electrically connect the tester board 30 and the lower package 10 to each other. The lower socket 110 includes a socket housing 111 and a plurality of socket pins 112 disposed inside the socket housing and spaced apart from each other. The socket pin 112 is formed of an electrically-conductive material so as transfer an electrical signal. One end of the socket pin 112 comes into contact with an electrode (not shown) provided on the tester board 30, and the other end of the socket pin 112 comes into contact with a lower terminal 11 of the lower package 10 placed on the socket housing 111. As shown in the drawings, the other end of the socket pin 112 is received in a socket groove 113 provided in an upper surface of the socket housing 111 and may thus come into contact with the lower terminal 11 of the lower package 10 placed above the socket groove 113.

In addition to the illustrated configuration, the lower socket 110 may be modified to have various other structures by which the lower socket may be mounted to the tester board 30 to electrically connect the tester board 30 and the lower package 10.

The guide housing 120 is installed on the lower socket 110. The guide housing 120 is provided with a receiving groove 121 in which the lower package 10 may be received. The receiving groove 121 may be formed to pass through the guide housing 120 in the vertical direction. The lower package 10 may reach the lower socket 110 through the receiving groove 121 of the guide housing 120. The guide housing 120 is provided with an inclined surface 122. The inclined surface 122 may guide the pusher 130 which is being moved downward towards the lower socket 110. That is, when the upper socket 140 is moved towards the lower socket 110 in a state where the pusher 130 is biased towards one side, the pusher 130 may come into contact with the inclined surface 122 to be guided along the inclined surface 122. Accordingly, the pusher 130 may align the upper package 20 to a normal position on the lower package 10.

In addition to the illustrated configuration, the guide housing 120 may be modified to have various other structures in which the lower package 10 may be placed therein.

The pusher 130 includes a pusher body 131 which may be moved to approach the lower socket 110 or to be moved away from the lower socket 110 by receiving the moving force from the driving part 40. A chamber 132 capable of receiving the upper package 20 therein and a vacuum hole 133 configured to transmit vacuum pressure are provided inside the pusher body 131. The chamber 132 is opened outward from one side of the pusher body 131. The vacuum hole 133 may be in communication with an external vacuum pressure generator (not shown) to transmit the vacuum pressure generated in the vacuum pressure generator to the chamber 132.

The above pusher 130 may be moved by the driving part 40 in a state where the upper socket 140 and the upper package 20 are coupled, to connect the upper socket 140 to the lower package 10 placed on the lower socket 110 or space the upper socket 140 apart from the lower package 10. In addition, the pusher 130 may load the lower package 10 onto the lower socket 110 or unload the lower package 10 from the lower socket 110 as it approaches the lower socket 110 or is moved away from the lower socket 110.

In addition to the illustrated configuration, the pusher 130 may be modified to have various other structures in which the upper socket 140 and the upper package 20 are mounted and may be moved by the driving part 40.

The upper socket 140 is coupled to one side of the pusher body 131 to enable the chamber 131 to be sealed. The upper socket 140 is electrically connected to the upper package 20 placed in the chamber 132. The upper socket 140 includes an insulating pad 141 covering the chamber 132 and a plurality of electrically-conductive parts 144 supported by the insulating pad 141.

The insulating pad 141 may be formed of a nonelastic insulating material. The insulating pad 141 made of a nonelastic insulating material is advantageous to pressurize the lower package 10 towards the lower socket 110 when the upper socket 140 comes into contact with the lower package 10. When the insulating pad 141 stably pressurizes the lower package 10, the lower terminal 11 of the lower package 10 may be stably connected to the socket pin 112 of the lower socket 110. Various synthetic resins may be utilized as the nonelastic insulating material used for manufacturing the insulating pad 141.

The insulating pad 141 is provided with an insulating pad hole 142. The insulating pad hole 142 is in communication with the chamber 132 so that the vacuum pressure in the chamber 132 can be transmitted.

The electrically-conductive part 144 is supported on the insulating pad 141 so as to pass through the insulating pad 141 in the thickness direction. One end of the electrically-conductive part 144 may be in contact with an upper package terminal 21 of the upper package 20 and the other end thereof may be connected to an upper terminal 12 of the lower package 10. The electrically-conductive part 144 includes an electrically-conductive part body 145 placed in the insulating pad 141 and an electrically-conductive part bump 146 connected to the electrically-conductive part body 145 so as to protrude from a lower surface of the insulating pad 141. When the upper socket 140 approaches the lower socket 110, the electrically-conductive part bump 146 is compressed to the upper terminal 12 of the lower package 10, so it may stably come into contact with the upper terminal 12. The electrically-conductive part 144 may be formed to have a configuration in which a plurality of electrically-conductive particles are included in an elastic insulating material.

As an elastic insulating material constituting the electrically-conductive part 144, a heat-resistant polymer material having a crosslinked structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester rubber, epichlorohydrin rubber, ethylene-propylene copolymer rubber, ethylene-propylene-diene copolymer rubber, soft liquid epoxy rubber, and the like may be employed.

In addition, as the electrically-conductive particles constituting the electrically-conductive part 144, particles having magnetism may be employed such that is may be reacted by a magnetic field. For example, as the electrically-conductive particles, particles obtained by plating a surface of core particle, for example, particles of metals exhibiting magnetism, such as iron, nickel, cobalt, etc., or alloy particles thereof, or particles containing these metals, or particles of these metals, with a metal having excellent electrical-conductivity, such as gold, silver, palladium, radium, or the like; particles obtained by plating a surface of core particle, for example, non-magnetic metal particles, inorganic substance particles such as glass beads or the like, and polymer particles, with electrically-conductive magnetic substance such as nickel, cobalt, or the like; or particles obtained by plating core particle with electrically-conductive magnetic substance and a metal having excellent electrical-conductivity may be employed.

A support film 160 is disposed on the upper socket 140. The support film 160 is interposed between the upper package 20 and the upper socket 140 to space the upper package 20 and the upper socket 140 apart from each other. A plurality of film holes 161 are formed in the support film 160 to pass through the support film 160 in the thickness direction. The upper package terminal 21 of the upper package 20 is inserted into the film hole 161, so the upper package terminal 21 may come into contact with the electrically-conductive part 144 through the film hole 161. At least one of the pluralities of film holes 161 is in communication with the insulating pad hole 142 of the insulating pad 141, and the vacuum pressure in the chamber 132 may transmitted to the insulating pad hole 142 through the film hole 161.

The support film 160 may be formed of a nonelastic insulating material, or other various insulating materials capable of spacing the upper package 20 and the upper socket 140 apart from each other.

The adsorption pad 150 may be coupled to the insulating pad 141 to adsorb the lower package 10. The adsorption pad 150 includes a suction hole 151 through which the vacuum pressure may be provided from the chamber 132. At least a portion of the adsorption pad 150 may be inserted into the insulating pad hole 142 of the insulating pad 141, and the suction hole 151 may be in communication with the chamber 132 through the insulating pad hole 142. The adsorption pad 150 may be moved in the insulating pad hole 142. When the upper socket 140 is connected to the lower package 10, the adsorption pad 150 may enter the insulating pad hole 142 such that the adsorption pad 150 does not interfere with a connection between the upper socket 140 and the lower package 10.

As described above, in the test apparatus 100 for a semiconductor package according to an embodiment of the present disclosure, in the state where the upper socket 140 and the upper package 20 are mounted to the pusher body 131, the pusher 130 may be moved by the driving part 40 to transport the lower package 10 over the lower socket 110. That is, the pusher 130 approaches over the lower package 10 which is being in a standby position to allow the adsorption pad 150 to adsorb the lower package 10, and the pusher 130 may be moved over the lower socket 110 to load the lower package 10 onto the lower socket 110. At this time, the lower terminal 11 of the lower package 10 is connected to the socket pin 112 of the lower socket 110.

Thereafter, as shown in FIG. 2, as the pusher 130 is moved towards the lower socket 110, the electrically-conductive part 144 of the upper socket 140 is connected to the upper terminal 12 of the lower package 10. At this time, since a pressurizing force of the pusher 130 is transmitted to the lower package 10 through the upper socket 140, the lower package 10 can maintain a stable connection state to the lower socket 110. As the upper socket 140 is connected to the lower package 10, the tester board 30, the lower socket 110, the lower package 10, the upper socket 140, and the upper package 20 are electrically connected to each other. In this state, the test signal generated in the tester board 30 is transmitted to the lower package 10 and the upper package 20, so an electrical test for the lower package 10 and the upper package 20 may be formed.

After the test is completed, the lower package 10 may be adsorbed on the adsorption pad 150 and then unloaded from the lower socket 110 according to a movement of the pusher 130.

As described above, in the test apparatus 100 for a semiconductor package according to one embodiment of the present disclosure, as compared with a conventional test apparatus having a pogo pin structure, a length of a signal transmission path is short, so it is possible to prevent signal distortion in high-speed signal transmission and it is possible to perform a precision test for a semiconductor package which is operated at a high speed.

In addition, in the test apparatus 100 for a semiconductor package according to one embodiment of the present disclosure, there is little risk of leakage of the vacuum pressure between the pusher 130 and the adsorption pad 150 providing for adsorbing the lower package 10, and by adopting a configuration in which the vacuum pressure is stably transmitted from the pusher 130 to the adsorption pad 150, it is possible to reduce a pickup error when the lower package 10 is picked-up.

Figure 3:
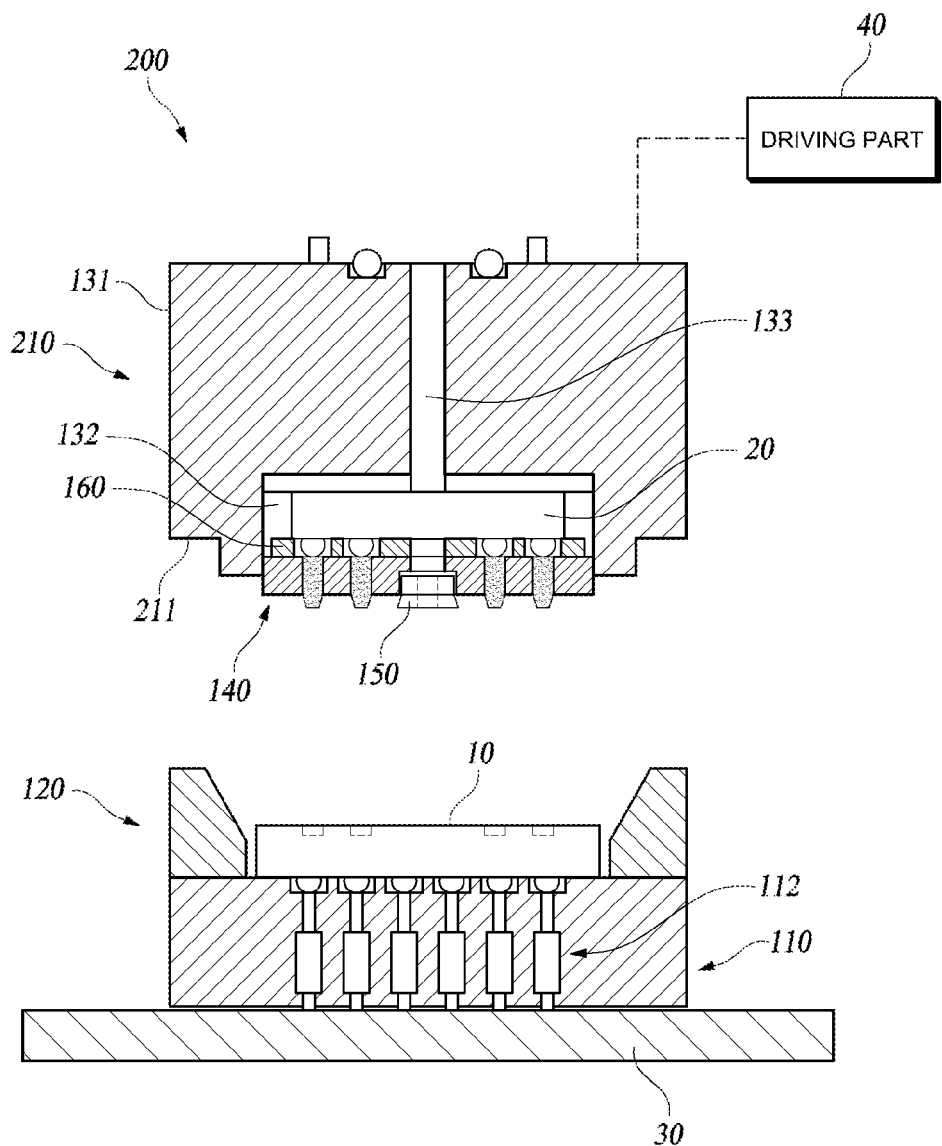
FIGS. 3 to 5 are views showing various modified examples of the test apparatus for a semiconductor package according to the present disclosure.
Figure 4:
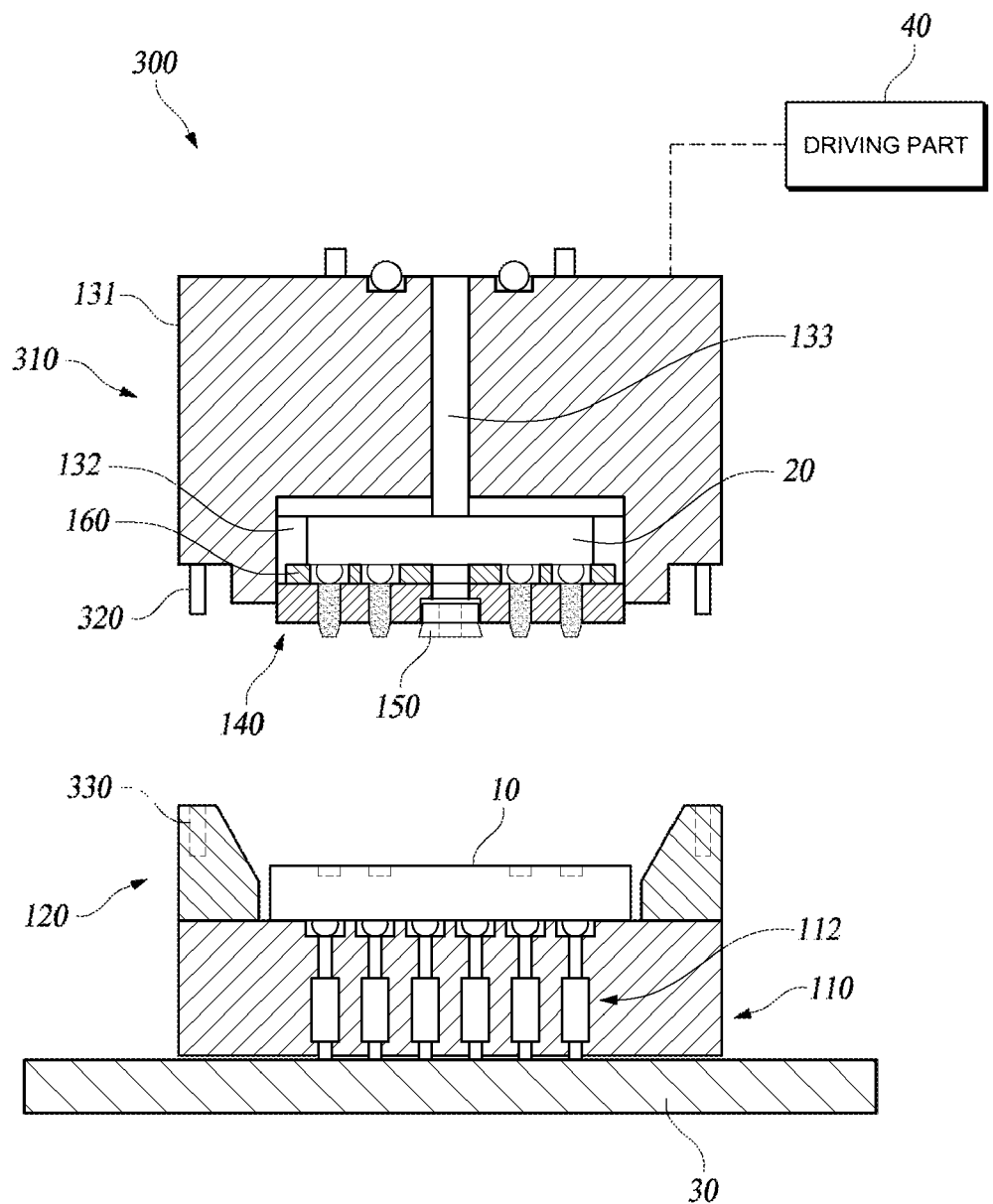
Figure 5:
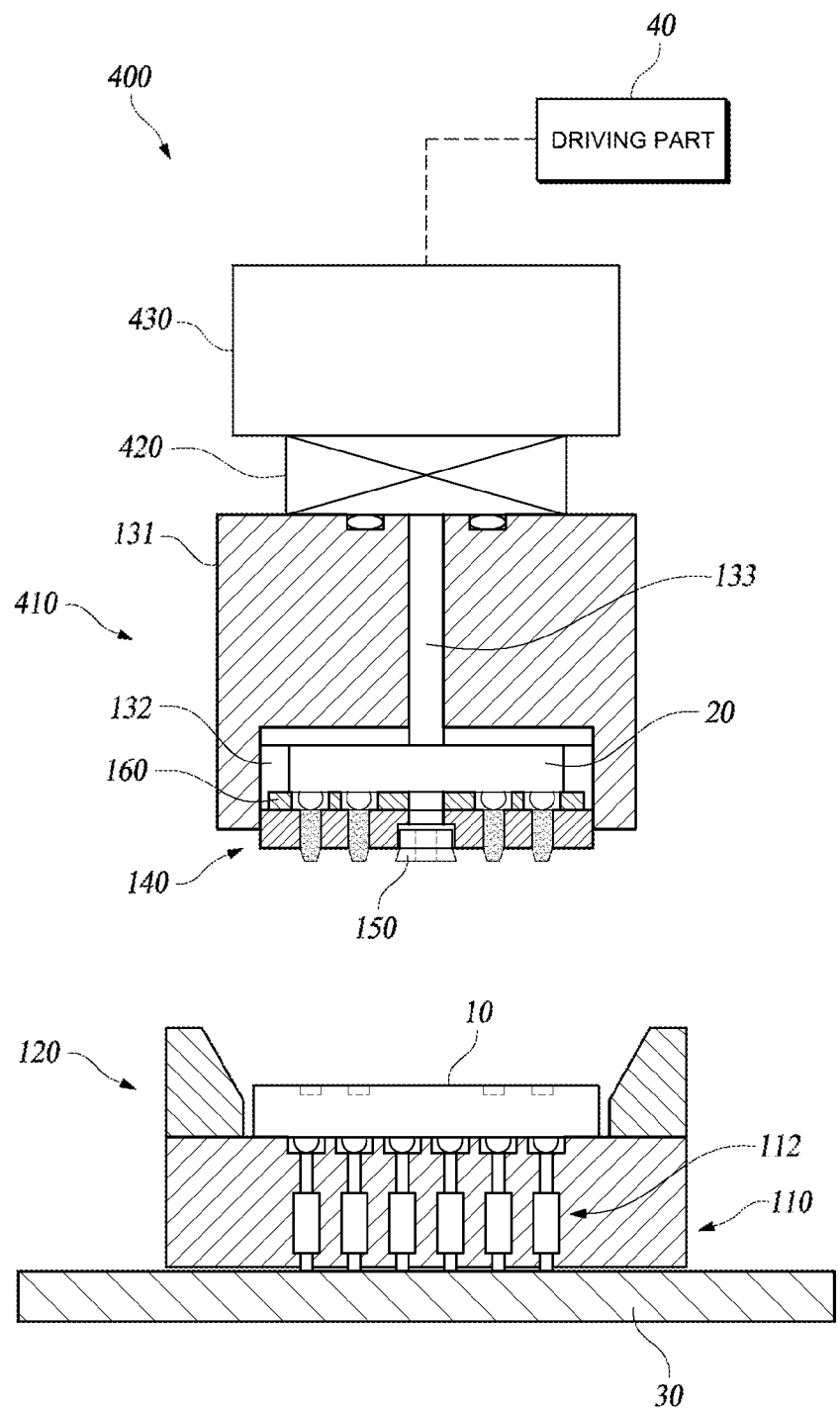

Meanwhile, FIGS. 3 to 5 are views showing various modified examples of the test apparatus for a semiconductor package according to the present disclosure.

First, a test apparatus 200 of the semiconductor package shown in FIG. 3 includes the lower socket 110 mounted to the tester board 30, the guide housing 120 coupled to the lower socket 110, a pusher 210 which may be moved by a moving force transmitted from the driving part 40 thereto, the upper socket 140 coupled and mounted to the pusher 210, and an adsorption pad 150 disposed on the upper socket 140 to adsorb the lower package 10. In the test apparatus 200 for such a semiconductor package, a configuration of the pusher 210 is partially modified.

As compared with the above-described pusher 130, the pusher 210 further includes a catching jaw 211 provided on the pusher body 131 so as to come into contact with the guide housing 120, thereby limiting a moving distance of the pusher body 131. When the pusher body 131 approaches the lower socket 110, the catching jaw 211 comes into contact with an upper end portion of the guide housing 120, so the pusher body 131 is stopped. In this way, by limiting the moving distance of the pusher body 131 which is moved towards the lower socket 110, using the catching jaw 211, it is possible to limit the amount of contact stroke obtained when the upper socket 140 comes into contact with and pressurizes the lower package 10. In addition, by limiting the amount of the contact stroke, the load applied to the lower package 10 may be limited so as not to be excessive.

In this embodiment, a separate stopper part corresponding to the catching jaw 211 of the pusher 210 may be provided in the guide housing 120. The stopper part may take various configurations according a shape of the catching jaw 211 and the like.

A test apparatus 300 for a semiconductor package shown in FIG. 4 includes the lower socket 110 mounted to the tester board 30, the guide housing 120 coupled to the lower socket 110, a pusher 310 which may be moved by a moving force transmitted from the driving part 40 thereto, the upper socket 140 coupled and mounted to the pusher 310, and the adsorption pad 150 disposed on the upper socket 140 to adsorb the lower package 10.

The pusher 310 includes an alignment pin 320 protruding from the pusher body 131. The alignment pin 320 is provided for aligning the pusher body 131, which is approaching the lower socket 110, on the lower package 10. An alignment hole 330 into which the alignment pin 320 may be inserted is provided in the guide housing 120.

When the pusher body 131 approaches the lower socket 110, the alignment pin 320 is inserted into the alignment hole 330, so the pusher body 131 may be guided to approach the lower socket 110 in a certain posture. By action of the alignment pin 320 and the alignment hole 330, the electrically-conductive part 144 of the upper socket 140 may accurately come into contact with the upper terminal 12 of the lower package 10.

The number or arrangement structure of the alignment pin 320 and the alignment hole 330 may be variously modified. In addition, a configuration in which the alignment pin 320 is provided in the guide housing 120 and the alignment hole 330 is provided in the pusher body 131 is also possible.

A test apparatus 400 for a semiconductor package shown in FIG. 5 includes the lower socket 110 mounted to the tester board 30, the guide housing 120 coupled to the lower socket 110, a pusher 410 which may be moved by a moving force transmitted from the driving part 40 thereto, the upper socket 140 coupled and mounted to the pusher 410, and the adsorption pad 150 disposed on the upper socket 140 to adsorb the lower package 10.

The pusher 410 includes a buffering unit 420. The buffering unit 420 serves to buffer a load applied to the pusher body 131 from the driving unit 40. The buffering unit 420 may be formed of a material having elasticity such as rubber, silicone or the like, or may take various structures capable of absorbing shock, such as a structure including a spring. Due to buffering action of the buffering unit 420, when the upper socket 140 is connected to the lower package 10, the load applied to the lower package 10 by the upper socket 140 may be limited so as not to be excessive. The buffering unit 420 may be supported by a connection member 430 connected to the driving part 40.

A technique for preventing oxidation between the upper package terminal 21 of the upper package 20 and the electrically-conductive part 144 of the upper socket 140 or a technique for controlling the compression amount of the electrically-conductive part bump 146 of the upper socket 140 may applied to the test apparatuses 100, 200, 300, and 400 for a semiconductor package for testing a package-on-package (POP) type semiconductor package according to the present disclosure. Of course, it is also possible to apply both of the above techniques to the above apparatuses.

As for this, the test apparatus 100 of the semiconductor package shown in FIG. 1 will be described as an example.

In the test apparatus for testing a package-on-package (POP) type semiconductor package, there is a case where the upper package 20 may be a normal package secured in advance to test the lower package 10. By connecting the upper package terminal 21 in the form of a solder ball of the upper package 20, which is a normal package, to the upper terminal 12 of the lower package 10, which is under test, through the electrically-conductive part 144 of the upper socket 140, it is possible to inspect whether the lower package 10 is being normally operated.

However, if the upper package terminal 21 comes into contact with the electrically-conductive part 144 of the upper socket 140 to allow an electrical current to flow therethrough, heat is generated between contact portions of the above two elements due to contact resistance, and tin (Sn) which is a main material of the upper package terminal 21 is oxidized by heat generated in the contact portions. In addition, as the inspection is repeated, oxidation of the upper package terminal 21 is increased, so contact resistance is further increased. For this reason, there is a problem in that, after tens to hundreds of repetitive inspections have been performed, it is difficult to form electrical connection due to high resistance, and therefore normal inspection of the lower package 10 is thus impossible.

Therefore, by coating a surface of the upper package terminal 21 with a metal that prevents surface oxidation, for example, a metal such as gold, palladium, rhodium, cobalt, or the like or an alloy of two or more of the above metals, even in repeated use, it is possible to prevent an increase in contact resistance between the electrically-conductive part 144 and the upper package terminal 21 due to oxidation of the upper package terminal. Accordingly, it is possible to enhance the inspection reliability of the lower package 10.

More preferably, it is preferable to apply nickel plating on a surface of the upper package terminal 21 first, and then coat the nickel-plated surface with an oxidation-inhibiting metal. Although oxidation of the upper package terminal 21 can be prevented by using only the oxidation-inhibiting metal such as gold, in the case of using gold, due to its characteristics, gold has a strong property of being absorbed and alloyed by other metals such as tin, which is the main material of the upper package terminal 21, and thus contact resistance may be increased after a large number of tests. However, if an under layer such as nickel is provided, since gold does not alloy with nickel, the normal upper package 20 can be used for inspection of the lower package 10 for a longer time.

As a method of coating the surface of the upper package terminal 21, for example, a brush plating method may be utilized. The brush plating method is a partial plating method using an electroplating technology, and does not use a plating bath as in general wet plating, and partial plating is possible using a dedicated brush tool and a rectifier. Accordingly, it is possible to easily coat a surface of solder ball with the oxidation-inhibiting metal using the brush plating method.

On the other hand, in the upper package terminal 21 in the form of a solder ball, deformation of the solder ball shape may be occurred due to repeated contact between the upper package terminal and the electrically-conductive part 144. Therefore, after the upper package terminal 21 in the form of a solder ball is melted at a high temperature and removed, a surface of the removed terminal may be coated with an oxidation-inhibiting metal, for example gold, palladium, rhodium, cobalt, or an alloy of two or more of these metals and utilized as the upper package terminal. The upper package terminal 21 formed in this way can an effect that it can be used even in a high temperature environment without deformation of an external shape of the terminal.

In order to reduce contact resistance between the upper package terminal 21 and the electrically-conductive part 144 of the upper socket 140, in addition to the above-described method of coating the surface of the solder ball of the upper package terminal 21 with an oxidation-inhibiting metal, a method of inserting a PCB connecting body 170 between the upper package 20 and the upper socket 140 is also possible.

Figure 6:
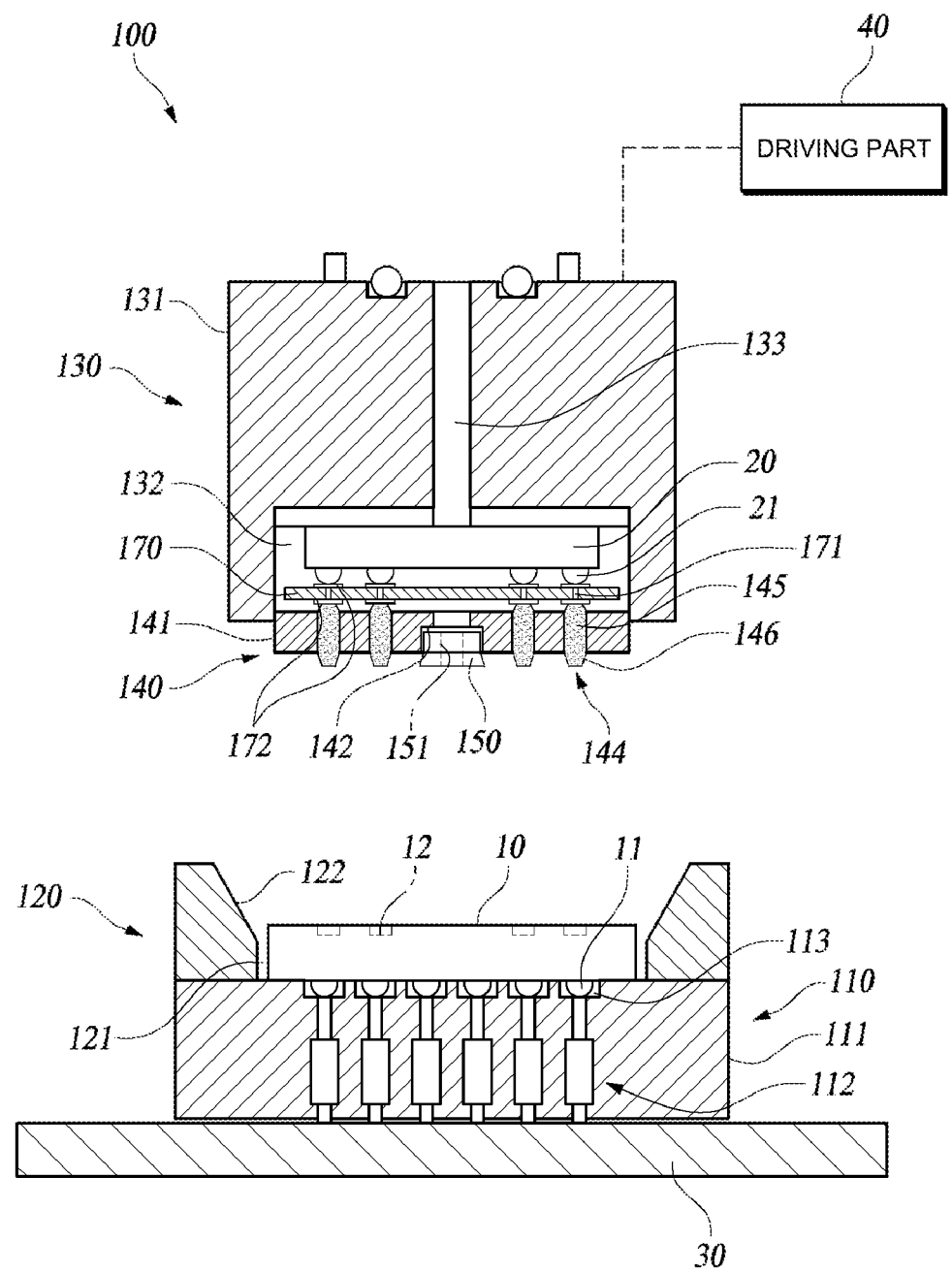
FIG. 6 is a view showing that a PCB connecting body is formed on the test apparatus for a semiconductor package according to the present disclosure.

As shown in FIG. 6, pads 172 coated with the oxidation-inhibiting metal are formed on upper and lower surfaces of a via 171 of the PCB connecting body 170 having an electrically-conductive path formed on an inner wall or an inner surface thereof, if the upper package terminal 21 and the electrically-conductive part 144 of the upper socket 140 are brought into contact with each other through the pads 172 of the PCB connecting body, even though repetitive inspections are performed, it is possible to prevent an increase in contact resistance due to the pads 172 coated with an oxidation-inhibiting metal. Therefore, the upper package 20, which is a normal package, enables stable and reliable inspection of more lower packages 10.

When using a method of reducing contact resistance between the upper package terminal 21 and the electrically-conductive part 144 of the upper socket 140 by using the PCB connector 170, it is preferable to remove the support film 160 shown in FIG. 1, and it is preferable that the electrically-conductive part 144 is formed to have a configuration in which the electrically-conductive part upper bump partially protrudes upward so that it can be more stably brought into contact with the pad 172 of the PCB connector 170 having a flat shape.

Figure 7:
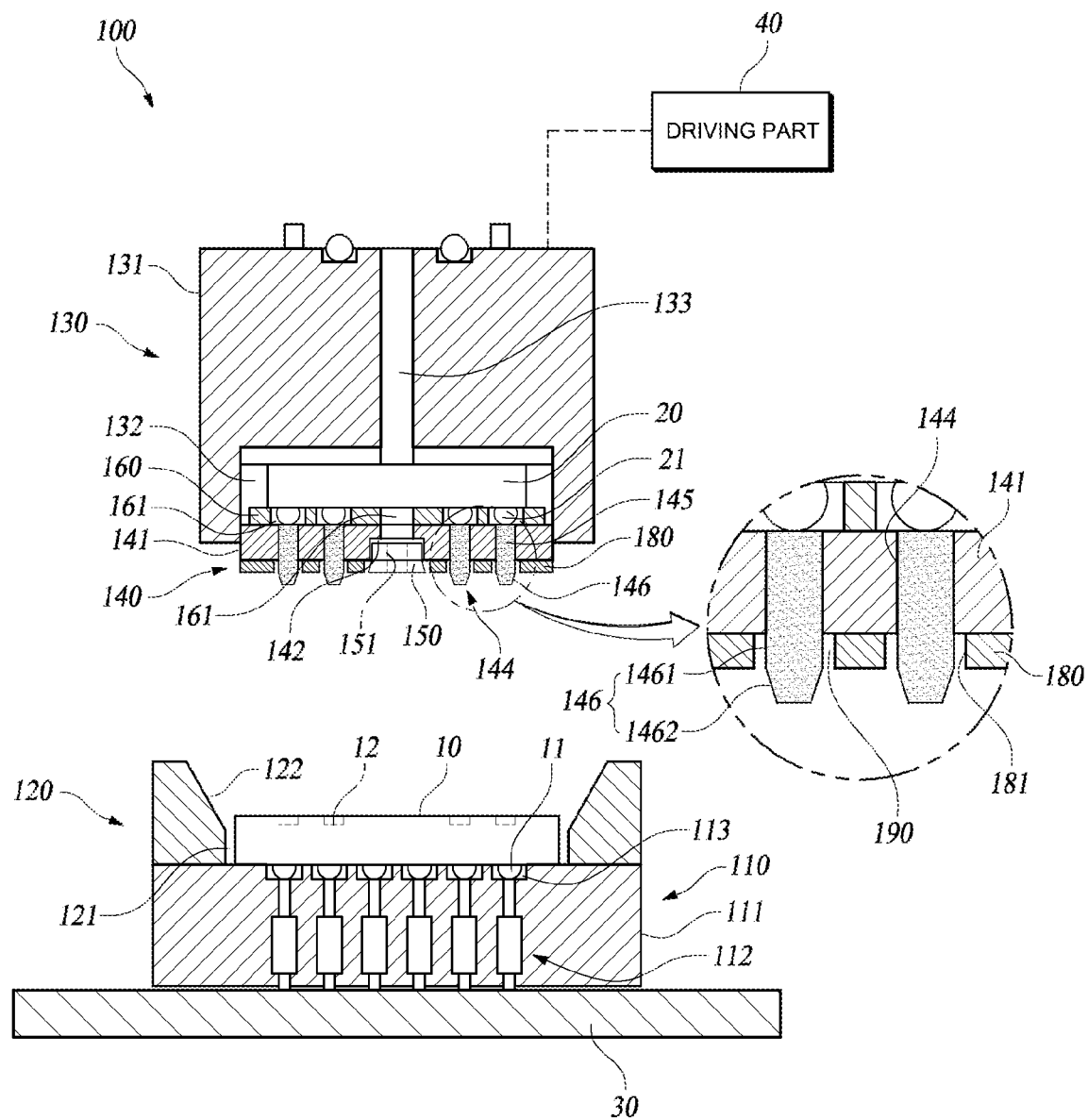
FIG. 7 is a view showing that a compression control sheet is applied to the test apparatus for a semiconductor package according to the present disclosure.
Figure 8:
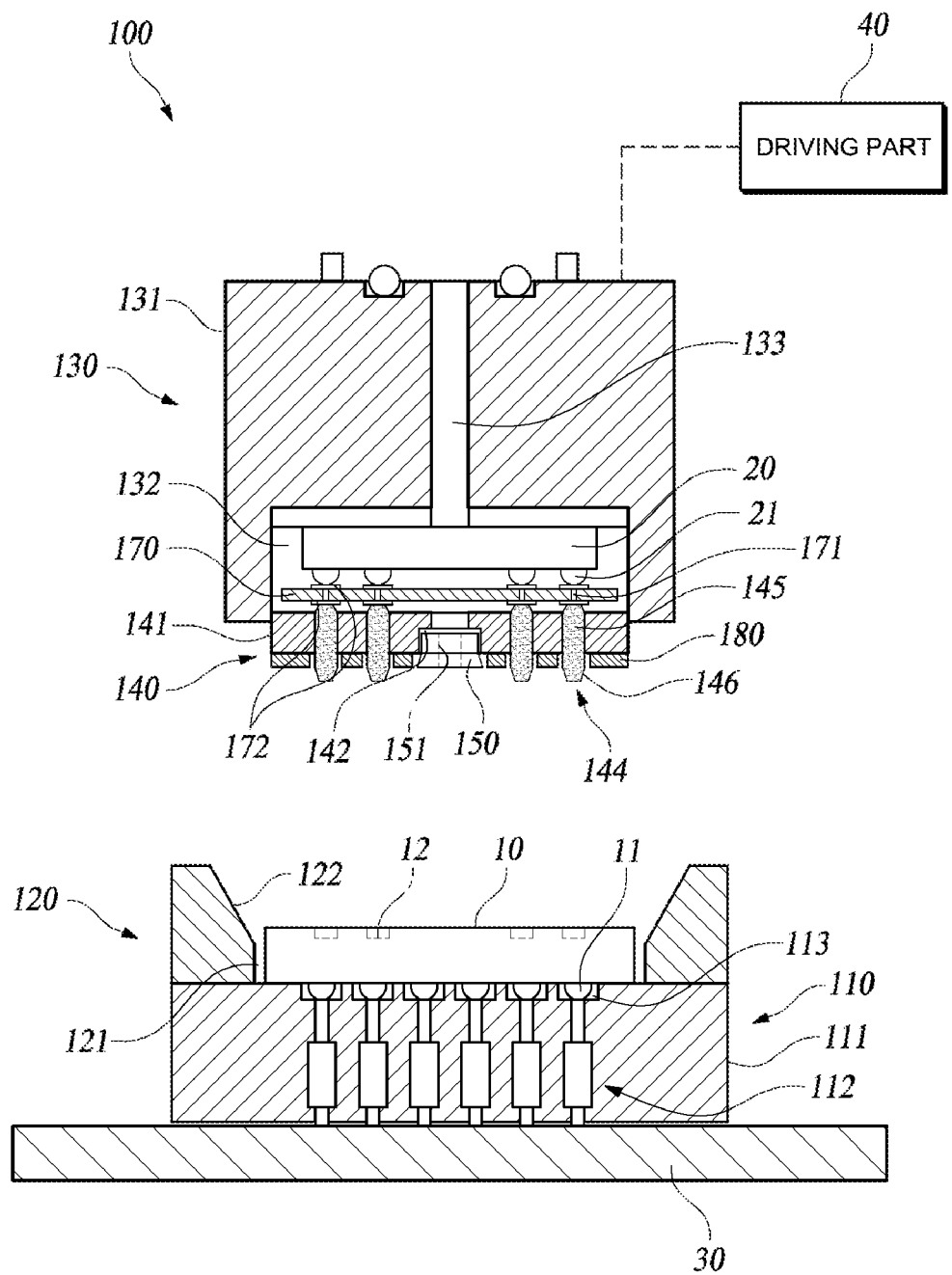
FIG. 8 is a view showing the PCB connecting body and the compression control sheet are applied to the test apparatus for a semiconductor package according to the present disclosure.

In addition, as shown in FIG. 7, in the test apparatus for testing a package-on-package (POP) type semiconductor package, a compression control sheet 180 having a predetermined thickness may be attached on a lower portion of the upper socket 140, that is, the lower surface of the insulating pad 141.

The compression control sheet 180 is an integral type sheet in which a through hole 181 having a diameter larger than that of the electrically-conductive part bump 146 is formed at a position thereof corresponding to the electrically-conductive part bump 146, this compression control sheet may be formed to have a thickness which is about half of the thickness of the electrically-conductive part bump 146, and is attached to surround the lower end portion 1461 of the electrically-conductive part bump 146 of the insulating pad 141 with the space part 190 interposed therebetween. Therefore, the space part 190 is provided in a region obtained by excluding a region occupied by the electrically-conductive bump 146 (that is, a region of the lower end portion 1461 of the electrically-conductive bump 146) from a region of the through hole 181 of the compression control sheet 146.

In addition, an upper end portion 1462 of the electrically-conductive part bump 146 is defined as a portion protruding from the compression control sheet 180.

A height of the upper end portion 1462 of the electrically-conductive part bump 146, that is, a height of the portion protruding from the compression control sheet 180 may be appropriately selected according to a diameter of the electrically-conductive part, a pitch of the electrically-conductive part, etc., but is preferably in the range of 5 μm to 500 μm, more preferably in the range of 10 μm to 300 μm, and most preferably in the range of 25 μm to 200 μm.

The compression control sheet 180 may be formed of a material which is the same as that of the insulating pad 141. Therefore, the compression control sheet 180 may be formed of a nonelastic insulating material such as various synthetic resins. Of course, the compression control sheet 180 and the insulating pad 141 may be formed of different materials.

The space part 190 formed between the compression control sheet 180 and the electrically-conductive part bump 146 serves as a space controlling the compression amount of the electrically-conductive part bump 146. When the upper socket 140 is pressurized by the pressurizing force of the pusher 130, the electrically-conductive part bump 146 can be compressed until the lower surface of the insulating pad 141 comes into contact with an upper surface of the lower package 10, so durability of the upper socket 140 may be deteriorated due to excessive compressive deformation of the electrically-conductive part bump 146.

Accordingly, in the present disclosure, by providing the space part 190 in the compression control sheet 180 and adjusting volume of the space part 190, the characteristics of the upper socket 140 required in various test environments may be provided. When the volume is reduced, the pressurizing force of the pusher 130 can be increased, so contact load between the upper socket and the upper terminal 12 of the lower package 10 can be increased, and thus the electrical conductivity can be further enhanced. Conversely, if the volume is increased, the contact load can be reduced, so the life of the upper socket can be extended. The present disclosure is advantageous in that it is possible to adjust the characteristics of the test socket according to the test environment as described above.

In addition, if the volume of the space part 190 is small, the electrically-conductive part bump 146 is compressed, and the compression control sheet 180 supports a portion of the electrically-conductive part bump 146 received in the space part 190, and thus deformation of the electrically-conductive part bumps 146 can be prevented. Furthermore, if the volume of the space part is increased, even if the electrically-conductive part bump 146 is compressed as much as possible, excessive compressive deformation of the electrically-conductive part bump 146 may be prevented by compressing it until only a lower surface of the compression control sheet 180 which is formed of a nonelastic material.

It is preferable that the volume of the space part 190 of the through hole 181 is included in a range greater than 0.2 times and less than 1.2 times the volume of the upper end portion 1462 of the electrically-conductive bump 146. When the volume of the space part 190 is less than 0.2 times the volume of the upper end portion 1462 of the electrically-conductive part bump 146, the deformation amount of the electrically-conductive part bump 146 cannot be sufficiently absorbed by the space part, and when the volume of the space part 190 is 1.0 times the volume of the upper end portion 1462 of the electrically-conductive part bump 146, the space part can theoretically absorb the entire volume of the upper end portion 1462 of the electrically-conductive part bump 146, However, since compression may not be smoothly performed due to flexibility of the electrically-conductive part bump 146, in order to facilitate compression, the volume of the space part 190 is preferably set to a range which is slightly larger than the volume of the upper end portion 1462 of the electrically-conductive part bump 146, but smaller than 1.2 times the volume of the upper end portion 1462.

Although the present disclosure has been described with a preferred example, a scope of the present disclosure is not limited to the form described and illustrated above.

For example, although a configuration in which the electrically-conductive part 144 of the upper socket 140 has the electrically-conductive part bump 146 protruding from the insulating pad 141 is illustrated in the drawings, if the lower package 10 is formed to have a configuration in which the upper terminal 12 thereof protrudes, the electrically-conductive part 144 may be formed to have a configuration in which it does not have the electrically-conductive part bump 146.

In addition, although a configuration in which the vacuum pressure supplied through the vacuum hole 133 of the pusher body 131 is transmitted to the adsorption pad 150 through the chamber 132 is illustrated in the drawings, a flow passage structure for transmitting the vacuum pressure supplied to the vacuum hole 133 to the adsorption pad 150 may be variously modified. As another example, it is possible to transmit the vacuum pressure to the insulating pad hole 142 of the insulating pad 141 via a gap formed between a lower end portion of the upper package 20 and an upper end portion of the upper socket 140 by removing a portion of the support film 160.

While the present disclosure has been described with reference to the embodiments illustrated in the figures, the embodiments are merely examples, and it will be understood by those skilled in the art that various changes in form and other embodiments equivalent thereto can be performed.

Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A test apparatus for a semiconductor package for testing a package-on-package (POP) type semiconductor package, comprising:
   a lower socket mounted to a tester board providing a test signal, and provided with a plurality of socket pins connected to a lower terminal of a lower package of the semiconductor package to electrically connect the lower package and the tester board to each other;
   a pusher to which an upper package of the semiconductor package is coupled, the pusher having a pusher body which may be moved to approach the lower socket or to be moved away from the lower socket; and
   an upper socket coupled to the pusher body, and provided with an insulating pad formed of a nonelastic insulating material and a plurality of electrically-conductive parts supported on the insulating pad, the electrically-conductive part being formed of an elastic insulating material containing a plurality of electrically-conductive particles such that one end thereof may be connected to an upper package terminal of the upper package and the other end thereof may be connected to an upper terminal of the lower package.

2. The test apparatus for the semiconductor package of claim 1, wherein the electrically-conductive part comprises an electrically-conductive part bump protruding from a lower surface of the insulating so as to be compressed to the upper terminal of the lower package.

3. The test apparatus for the semiconductor package of claim 2, further comprising a compression control sheet attached to a lower surface of the insulating pad and having a through hole formed therein to surround a lower end portion of the electrically-conductive bump, with a space part being formed between the through hole and the lower end portion of the electrically-conductive bump.

4. The test apparatus for the semiconductor package of claim 3, wherein a volume of the space part of the through hole is included in a range greater than 0.2 times and less than 1.2 times the volume of the upper end portion of the electrically-conductive bump.

5. The test apparatus for the semiconductor package of claim 1, wherein a surface of the upper package terminal is coated with an oxidation-inhibiting metal.

6. The test apparatus for the semiconductor package of claim 5, wherein the oxidation-inhibiting metal is gold, palladium, rhodium, cobalt, or a metal obtained by alloying two or more metals thereof.

7. The test apparatus for the semiconductor package of claim 1, wherein a PCB connecting body is inserted between the upper package and the upper socket, the PCB connecting body is provided with pads which are coated with an oxidation-inhibiting metal and mounted on upper and lower surfaces, respectively, of a via having an electrically-conductive path formed on an inner wall or an inner surface thereof, the upper package terminal is in contact with the pad mounted on the upper surface, and the electrically-conductive part of the upper socket is in contact with the pad mounted on the lower surface.

8. The test apparatus for the semiconductor package of claim 7, wherein an oxidation-inhibiting metal is gold, palladium, rhodium, cobalt, or a metal obtained by alloying two or more metals thereof.

9. The test apparatus for the semiconductor package of claim 1, further comprising an adsorption pad provided with a suction hole to which vacuum may be supplied through the pusher, and coupled to the insulating pad so as to adsorb the lower package.

10. The test apparatus for the semiconductor package of claim 9, wherein the adsorption pad is movably disposed in an insulating pad hole provided in the insulating pad.

11. The test apparatus for the semiconductor package of claim 1, wherein the pusher comprises a chamber provided in the pusher body to be opened outward for receiving the upper package therein, and the upper socket is coupled to the pusher body to seal the chamber.

12. The test apparatus for the semiconductor package of claim 1, further comprising a guide housing provided with a receiving groove capable of receiving the lower package therein and disposed above the lower socket, wherein the pusher comprises a catching jaw provided on the pusher body so as to come into contact with the guide housing, thereby limiting a moving distance of the pusher body approaching the lower socket.

13. The test apparatus for the semiconductor package of claim 1, further comprising a guide housing provided with a receiving groove capable of receiving the lower package therein and disposed above the lower socket, wherein an alignment hole is provided in one of the pusher body and the guide housing, and an alignment pin to be inserted into the alignment hole so as to align the pusher body approaching the lower socket is provided in the other one of the pusher body and the guide housing.

14. The test apparatus for the semiconductor package of claim 1, wherein the pusher comprises a buffering unit coupled to the pusher body to buffer pressure applied to the pusher body from a driving part for limiting a load applied to the lower package by the upper socket.

15. The test apparatus for the semiconductor package of claim 1, further comprising a support film provided with a plurality of film holes into which the upper package terminals of the upper package may be inserted, and disposed between the upper package and the upper socket to space the upper package and the upper socket apart from each other.

* * * * *